(12) United States Patent
Kim

(10) Patent No.: US 8,432,734 B2
(45) Date of Patent: Apr. 30, 2013

(54) NONVOLATILE MEMORY DEVICE AND SYSTEM AND RELATED METHOD OF OPERATION

(75) Inventor: Moo Sung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 396 days.

(21) Appl. No.: 12/780,988

(22) Filed: May 17, 2010

(65) Prior Publication Data

US 2011/0085379 A1    Apr. 14, 2011

(30) Foreign Application Priority Data

Oct. 14, 2009  (KR) .................. 10-2009-0097748

(51) Int. Cl.
*G11C 16/04*    (2006.01)
(52) U.S. Cl.
USPC ............. 365/185.03; 365/185.18; 365/185.22
(58) Field of Classification Search ............. 365/185.03, 365/185.18, 185.22
See application file for complete search history.

(56) References Cited

U.S. PATENT DOCUMENTS

| | | | |
|---|---|---|---|
| 2008/0106946 A1 | 5/2008 | Inoue et al. | |
| 2008/0205137 A1 | 8/2008 | Yanagidaira et al. | |
| 2009/0086545 A1 | 4/2009 | Lee | |
| 2009/0323431 A1* | 12/2009 | Chun et al. ............... | 365/185.22 |

FOREIGN PATENT DOCUMENTS

| | | |
|---|---|---|
| JP | 2008027511 A | 2/2008 |
| JP | 2008117471 A | 5/2008 |
| KR | 1020080040592 A | 5/2008 |
| KR | 1020090032246 A | 4/2009 |

* cited by examiner

*Primary Examiner* — Huan Hoang
(74) *Attorney, Agent, or Firm* — Volentine & Whitt, PLLC

(57) ABSTRACT

A nonvolatile memory device detects a first memory cell to be successfully programmed in a program operation for multiple memory cells connected to a wordline, and then detects a number of program loops required to successfully program the remaining memory cells connected to the wordline. An initial program voltage of subsequent program operations is then adjusted based on the detected number of loops.

26 Claims, 15 Drawing Sheets

NONVOLATILE MEMORY DEVICE AND SYSTEM AND RELATED METHOD OF OPERATION

CROSS-REFERENCE TO RELATED APPLICATIONS

This application claims priority under 35 U.S.C. §119 to Korean Patent Application No. 10-2009-0097748 filed on Oct. 14, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile semiconductor memory devices and systems, and related methods of operation.

Semiconductor memory devices can be roughly divided into two categories including volatile memory devices and nonvolatile memory devices. Volatile memory devices lose stored data when disconnected from power and nonvolatile memory devices retain stored data when disconnected from power. Examples of volatile memory devices include static random access memory (SRAM), dynamic random access memory (DRAM), and synchronous dynamic random access memory (SDRAM). Examples of nonvolatile memory devices include read-only memory (ROM), programmable read-only memory (PROM), erasable programmable read-only memory (EPROM), electrically erasable and programmable read-only memory (EEPROM), flash memory, phase-change random access memory (PRAM), magnetoresistive random access memory (MRAM), resistive random access memory (RRAM), and ferroelectric random access memory (FRAM).

Among nonvolatile memory devices, flash memory is one of the most widely adopted, with numerous electronic devices using flash memory for long term mass data storage and/or code storage. Examples of devices using flash memory include portable electronic devices, such as digital cameras and smart phones, solid state disks, and so on.

Flash memory has two common configurations presenting distinct performance tradeoffs. These configurations include NOR-type flash memory, which tends to have relatively higher read speed and is therefore useful for storing operating code, and NAND-type flash memory, which tends to have relatively higher integration density, allowing for greater storage capacity.

SUMMARY

Selected embodiments of the inventive concept provide a nonvolatile memory device having increased operation speed while maintaining reliability, a method of operating the same, and a memory system comprising the same.

According to one embodiment of the inventive concept, a method of operating a nonvolatile memory device comprises initiating a program operation on a plurality of memory cells, detecting at least one program-passed memory cell among the plurality of memory cells, generating a count value by counting a number of program loops performed between detecting the program-passed memory cell and completion of the program operation, and adjusting an initial program voltage to be used in subsequent programming of the memory cells based on the count value.

In certain embodiments, adjusting the initial program voltage is performed upon determining that the count value is greater than a reference value. In certain embodiments, the initial program voltage is adjusted according to a level of a program voltage used in a program loop where the program-passed memory cell is detected.

In certain embodiments, each of the memory cells is configured to store "n" bits, and adjusting the initial program voltage comprises adjusting the initial program voltage for programming $(k+1)^{th}$ through $n^{th}$ bits in the memory cells based on the count value after a least significant bit (LSB) through $k^{th}$ bits are programmed in the memory cells.

In certain embodiments, each of the memory cells is configured to store "n" bits, and adjusting the initial program voltage comprises adjusting the initial program voltage for programming $(k+1)^{th}$ bits in the memory cells based on the count value after a least significant bit (LSB) through $k^{th}$ bits are programmed in the memory cells.

In certain embodiments, the initial program voltage is adjusted independently for different word lines of the nonvolatile memory device. In certain embodiments, detecting at least one program-passed memory cell comprises determining whether a number of program-passed memory cells have reached a predetermined value.

According to another embodiment of the inventive concept, a nonvolatile memory device comprises a memory cell array, a read/write circuit configured to access the memory cell array, and a control logic circuit configured to provide a program voltage to the memory cell array. The control logic circuit is configured to adjust an initial program voltage in a program operation based on a number of program loops performed between detection of at least one program-passed memory cell and completion of a prior program operation.

In certain embodiments, the control logic circuit is configured to provide a default initial program voltage to the memory cell array where the number of the program loops is less than a reference value. In certain embodiments, the control logic circuit is configured to adjust the initial program voltage where the number of the program loops is greater than the reference value.

In certain embodiments, the control logic circuit is configured to adjust the initial program voltage according to a level of a program voltage upon detection of the at least one program-passed memory cell. In certain embodiments, each of multiple memory cells in the memory cell array is configured to store "n" bits, and the control logic circuit is configured to adjust the initial program voltage for programming $(k+1)^{th}$ through $n^{th}$ bits in the memory cells based on a number of the program loops performed to program a least significant bit (LSB) through $k^{th}$ bits in the memory cells.

In certain embodiments, each of multiple memory cells in the memory cell array is configured to store "n" bits, and the control logic circuit is configured to adjust the initial program voltage for programming $(k+1)^{th}$ bits in the memory cells based on a number of program loops performed to program a least significant bit (LSB) through $k^{th}$ bits in the memory cells. In certain embodiments, the initial program voltage is adjusted independently for different word lines of the nonvolatile memory device.

In certain embodiments, the control logic circuit is configured to count a number of program loops performed between detection of the at least one program-passed memory cell and completion of the program operation reaches a predetermined value.

In certain embodiments, the control logic circuit comprises a first register configured to store at least one default initial program voltage, and a second register configured to store at least one adjusted initial program voltage. A level of a program voltage at the detection of the at least one program-passed memory cell is stored in the second register.

In certain embodiments, the control logic circuit further comprises a counter configured to start a count operation upon detection of the at least one program-passed memory cell and to increment a count value in subsequent program loops, a storage circuit configured to store a reference value, a comparator comparing the count value with the reference value to generate a selection signal, and a multiplexer configured to select an output of the first register or an output of the second register in response to the selection signal. The output of the second register is selected where the count value is greater than the reference value.

In certain embodiments, the output of the first register is selected where the count value is less than the reference value.

According to still another embodiment of the inventive concept, a memory system comprises a nonvolatile memory device, and a controller configured to control the nonvolatile memory device. The nonvolatile memory device comprises a memory cell array, a read/write circuit configured to access the memory cell array, and a control logic circuit configured to provide a program voltage to the memory cell array. The control logic circuit is configured to adjust an initial program voltage in a program operation based on a number of program loops performed between detection of at least one program-passed memory cell and completion of a prior program operation.

In certain embodiments, the nonvolatile memory device and the controller constitute a solid state drive.

BRIEF DESCRIPTION OF THE DRAWINGS

Embodiments of the inventive concept are described below with reference to the accompanying drawings. In the drawings, like reference numbers denote like features.

DETAILED DESCRIPTION OF THE EMBODIMENTS

Embodiments of the inventive concept are described below with reference to the accompanying drawings. These embodiments are provided as teaching examples and should not be construed to limit the scope of the inventive concept.

Figure 1:
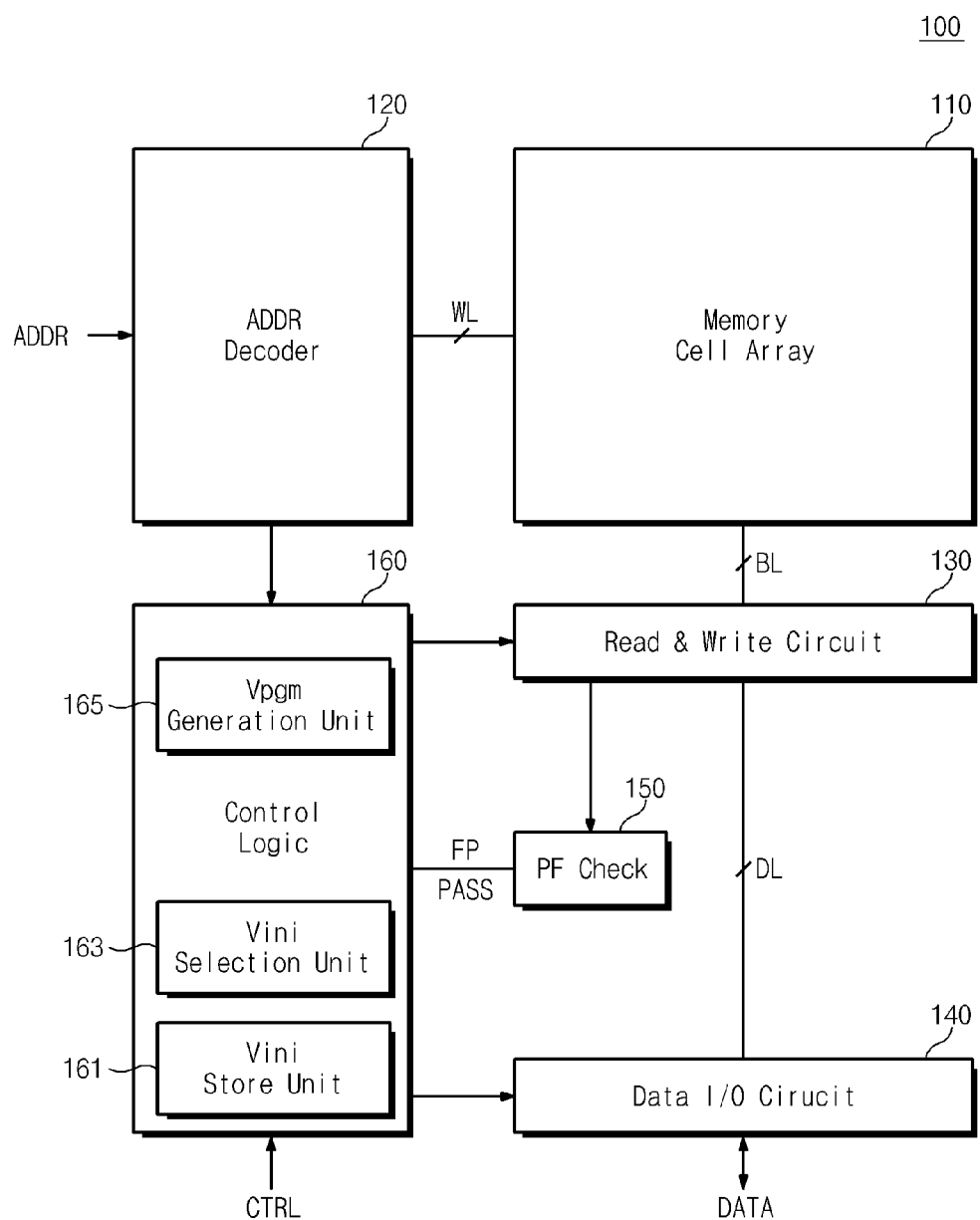
FIG. 1 is a block diagram of a nonvolatile memory device according to an embodiment of the inventive concept.

FIG. 1 is a block diagram of a nonvolatile memory device 100 according to an embodiment of the inventive concept. For explanation purposes, it will be assumed that nonvolatile memory device 100 is a flash memory device. However, the inventive concept is not limited to flash memory devices. For instance, in various alternative embodiments, nonvolatile memory device 100 further comprises a read only memory (ROM), a programmable read only memory (PROM), an erasable programmable read only memory (EPROM), electrically erasable programmable read only memory (EEPROM), flash memory, phase change random access memory (PRAM), magnetoresistive random access memory (MRAM), resistive random access memory (RRAM) and a ferroelectric random access memory (FRAM).

Referring to FIG. 1, flash memory device 100 comprises a memory cell array 110, an address decoder 120, a read/write circuit 130, a data input/output (I/O) circuit 140, a pass/fail (PF) check circuit 150, and a control logic circuit 160.

Memory cell array 110 is connected to address decoder 120 via word lines WL and is connected to read/write circuit 130 via bit lines BL. Memory cell array 110 comprises a plurality of memory cells connected to word lines WL and bit lines BL. Rows of the memory cells are connected to word lines WL, and columns of the memory cells are connected to bit lines BL. Memory cell array 110 is configured to store one or more bits per memory cell and will be will be described in further detail with reference to FIGS. 2 and 3.

Address decoder 120 is connected to memory cell array 110 via word lines WL and operates under the control of control logic circuit 160. Address decoder 120 typically comprises a row decoder, a column decoder, and an address buffer.

Address decoder 120 receives an address ADDR from an external device and decodes a row address among the received addresses ADDR to select word lines WL. Program voltages, read voltages, or erase voltages are provided to memory cell array 110 through the selected word lines and the unselected word lines. These voltages can be supplied, for instance, by control logic circuit 160. Address decoder 120 also decodes a column address from the received address ADDR and transfers the decoded column address to read/write circuit 130.

Read/write circuit 130 is connected to memory cell array 110 via bit lines BL, is connected to data I/O circuit 140 via data lines DL, and is connected to PF check circuit 150. Read/write circuit 130 operates under the control of control logic circuit 160. Read/write circuit 130 receives the decoded column address from address decoder 120 and selects bit lines BL in response to the decoded column address. Read/write circuit 130 provides program voltages, read voltages, and erase voltages to memory cell array 110 through the selected bit lines and the unselected bit lines.

In a program operation, read/write circuit 130 receives data from data I/O circuit 140 and programs the received data in memory cell array 110. In a read operation, read/write circuit 130 reads data from memory cell array 110 and transfers the read data to data I/O circuit 140. In a copy-back operation, read/write circuit 130 reads data from a first storage region of memory cell array 110 and programs the read data in a second storage region of memory cell array 110.

Read/write circuit 130 typically comprises a page buffer (or a page register) and a column selection circuit. Alternatively, read/write circuit 130 may comprise a sense amplifier, a write driver, and a column selection circuit.

Data I/O circuit 140 is connected to read/write circuit 130 via data lines DL. Data I/O circuit 140 operates under the control of control logic circuit 160 and exchanges data with an external device. Data received from the external device is transferred through data lines DL to read/write circuit 130. Data received from read/write circuit 130 is output to an external device. Data I/O circuit 140 typically comprises a data buffer.

PF check circuit 150 is connected to read/write circuit 130 and control logic circuit 160. In a program verify operation, PF check circuit 150 receives data read by read/write circuit 130 and determines whether selected memory cells have been successfully programmed (program pass) or whether they require further programming (program fail) based on the data received from read/write circuit 130.

Where the selected memory cells are all program-passed, PF check circuit 150 provides a pass signal PASS to control logic circuit 160. Where the number of program-failed memory cells among the selected memory cells is less than a predetermined number, PF check circuit 150 provides a pass signal PASS to control logic circuit 160. The predetermined number may be less than the number of error bits that can be corrected by an error correction code (ECC) of flash memory device 100 or an ECC of a controller of flash memory device 100.

PF check circuit 150 detects the first memory cells, or first group of a predetermined number of memory cells, to be successfully programmed in a program operation, based on the data received from read/write circuit 130. The occurrence of this initial programming constitutes a "first pass event." In other words, the first instance where a sufficient number of memory cells are successfully programmed will be referred to as a "first pass event." The predetermined number may be less than the number of error bits that can be corrected by an ECC of flash memory device 100 or an ECC of a controller of flash memory device 100.

A first pass event verify operation is a verify operation that detects the first pass event in a program operation. In the first pass event verify operation, data in the page buffer of read/write circuit 130 that corresponds to successfully programmed memory cells is inverted so that the successfully programmed memory cells are not further programmed in subsequent program loops. Rather, the successfully programmed memory cells receive a program inhibition voltage in the subsequent program loops.

Where the verify voltage is applied, a logic low level is stored in the page buffer corresponding to the memory cells with a threshold voltage lower than the verify voltage. That is, where the first pass event verify operation is performed, a logic level "high" is stored in the page buffer corresponding to the memory cells having a threshold voltage higher than the verify voltage and a logic level "low" is stored in the remaining page buffer. PF check circuit 150 is configured to detect the first pass event by detecting the logic high level. Where the first pass event is detected, PF check circuit 150 transfers a first pass signal FP to control logic circuit 160.

Control logic circuit 160 is connected to address decoder 120, read/write circuit 130, data I/O circuit 140 and PF check circuit 150. Control logic circuit 160 controls various operations of flash memory device 100 in response to a control signal CTRL received from an external device. Control logic circuit 160 is configured to receive pass signal PASS and first pass signal FP from PF check circuit 150.

Control logic circuit 160 comprises an initial program voltage Vini storage unit 161, a Vini selection unit 163, and a program voltage (Vpgm) generation unit 165.

Vini storage unit 161 stores default voltage information VId and adjusted voltage information VIa. Default voltage information VId comprises information regarding the level of a default initial program voltage Vd (hereinafter, a default voltage) used in flash memory device 100. Adjusted voltage information VIa comprises information regarding the level of an initial program voltage Va (hereinafter, an adjusted voltage) adjusted through a program operation. For example, control logic circuit 160 is configured to set adjusted voltage information VIa in response to first pass signal FP.

Vini selection unit 163 is configured to select voltage information stored in Vini storage unit 161 in response to pass signal PASS and first pass signal FP. The selected voltage information VI is transferred to Vpgm generation unit 165.

Vpgm generation unit 165 receives the selected voltage information VI from Vini selection unit 163 and generates a program voltage in response to the received voltage information. In a first program loop, Vpgm generation unit 165 outputs an initial program voltage Vini corresponding to the received voltage information VI as a program voltage Vpgm. In subsequent program loops, Vpgm generation unit 165 incrementally increases the level of program voltage Vpgm from initial program voltage Vini in an incremental step pulse program (ISPP) operation.

In the ISPP operation, each program loop comprises alternately applying program voltage Vpgm and the verify voltage to selected memory cells. The program loop repeats until pass signal PASS is asserted or until the number of program loops reaches a predetermined limit (e.g., a maximum count number). The generated program voltage is provided to word lines WL via address decoder 120.

Figure 2:
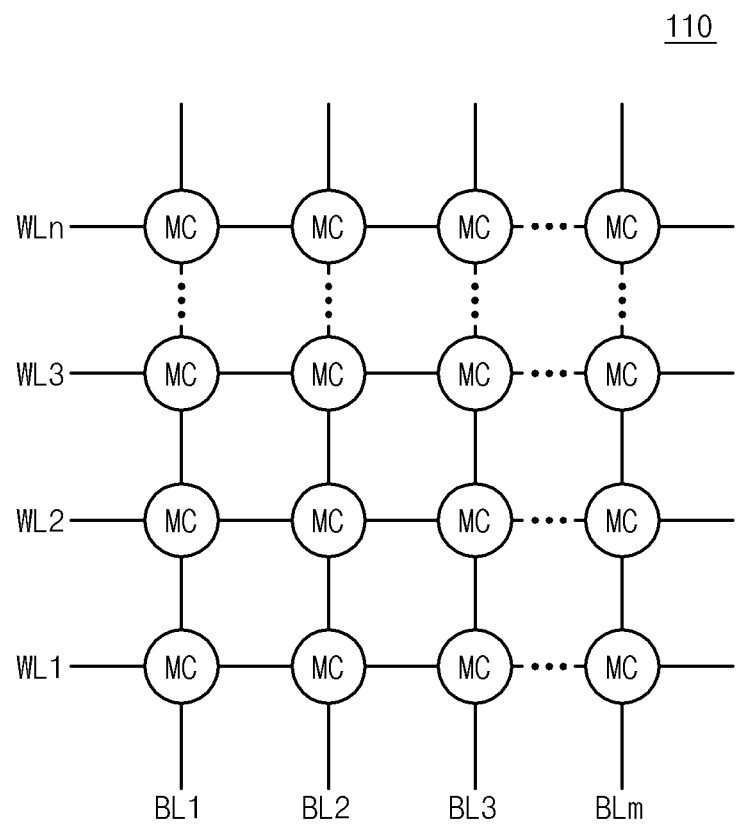
FIG. 2 is a diagram illustrating a portion of a memory cell array of FIG. 1.

FIG. 2 is a diagram illustrating a portion of memory cell 110 array of FIG. 1. This portion of memory cell array 110 comprises first through $n^{th}$ word lines WL1 through WLn and first to $m^{th}$ bit lines BL1 through BLm connected to a plurality of memory cells arranged in rows and columns. Memory cells MC are disposed at intersections of word lines WL1 through WLn and bit lines BL1 through BLm.

Program operations are typically performed in memory cell array 110 on a page basis, where a page comprises a plurality of bits corresponding to a number of memory cells in a row. Where each memory cell MC stores 1 bit, memory cells MC connected to one word line (e.g., WL1) form one page. Where each memory cell MC stores 2 bits, the memory cells connected to one word line (e.g., WL1) form two pages. Least significant bits (LSBs) of memory cells connected to one word line (e.g., WL1) form a LSB page, and most significant bits (MSBs) the memory cells form a MSB page. Likewise, where each memory cell MC stores "i" bits, the memory cells connected to one word line (e.g., WL1) form "i" pages.

Figure 3:
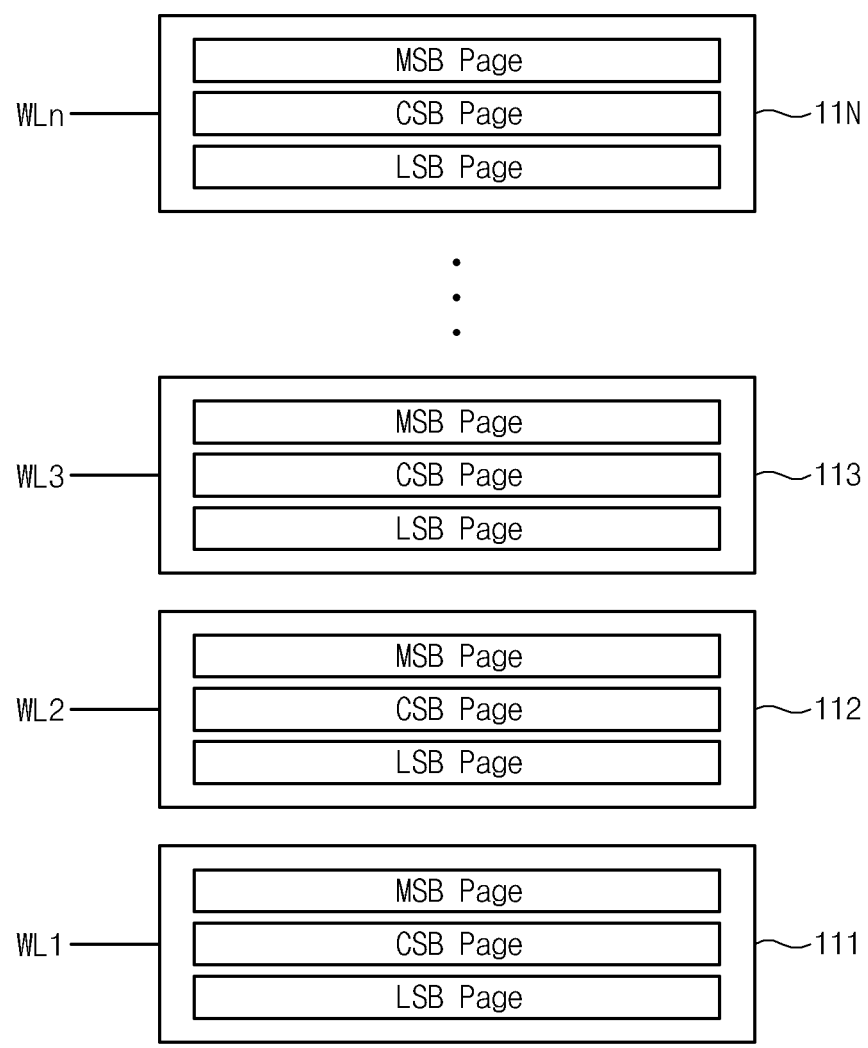
FIG. 3 is a diagram illustrating pages of a memory cell array configured to store 3 bits per cell.

FIG. 3 is a conceptual diagram illustrating pages of memory cell array 110 configured to store 3 bits per cell. In FIG. 3, bit lines BL and the memory cells are omitted from the illustration. The memory cells connected to first word line WL1 form a LSB page, a central significant bit (CSB) page, and a MSB page. Likewise, the memory cells connected to each of the second to n$^{th}$ word lines WL2 through WLn form a LSB page, a CSB page, and a MSB page.

Figure 4:
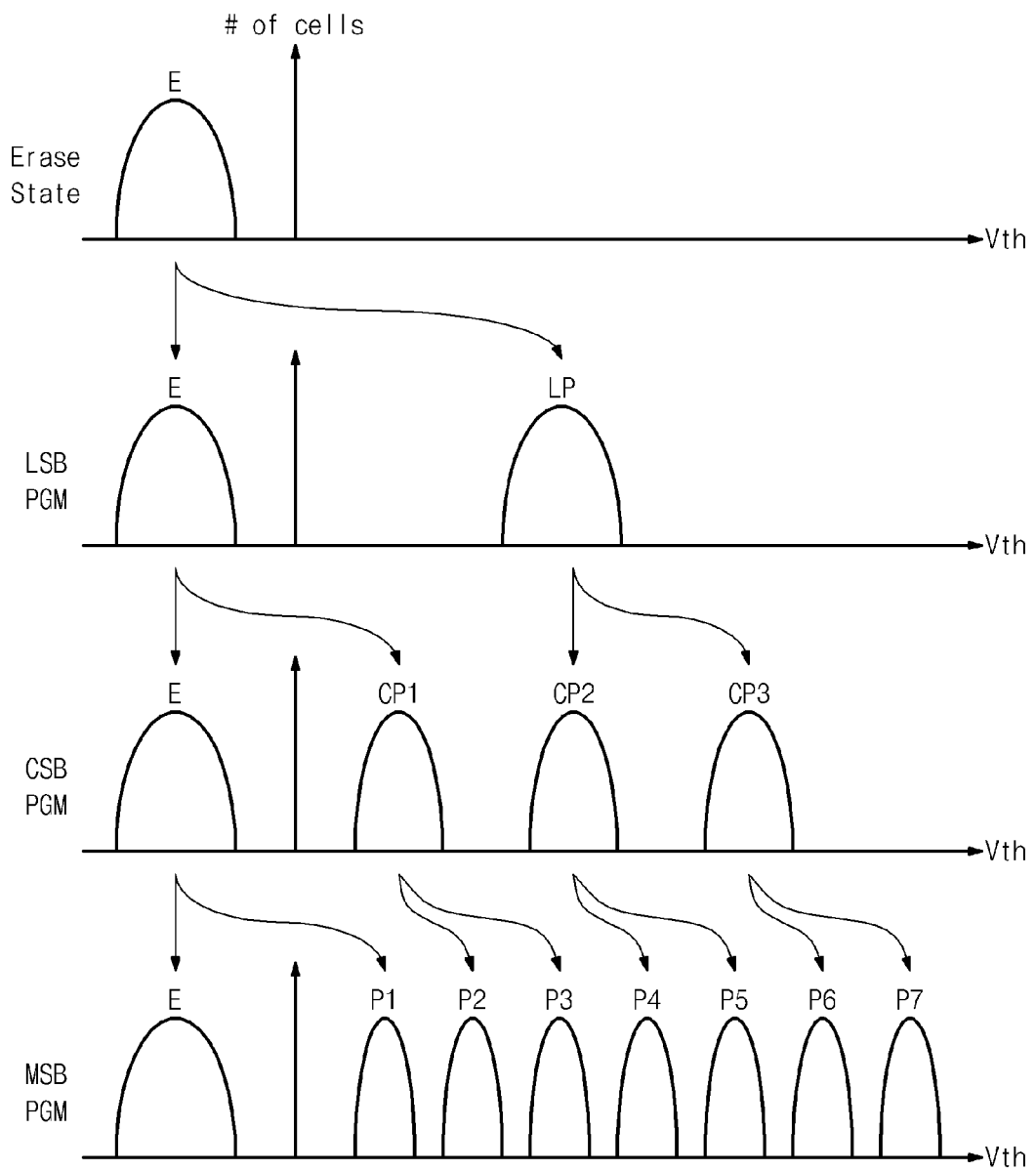
FIG. 4 is a threshold voltage diagram illustrating a method of programming data in the memory cell array of FIGS. 2 and 3.

FIG. 4 is a threshold voltage diagram illustrating a method of programming data in the memory cell array of FIGS. 2 and 3. In FIG. 4, the x-axis represents threshold voltages of memory cells and the y-axis represents the number of memory cells. That is, FIG. 4 illustrates threshold voltage distributions of a collection of memory cells.

In the example of FIG. 4, it is assumed that memory cells connected to first word line WL1 of FIG. 3 are programmed, beginning from an erased state "E".

In a LSB program operation, the memory cells in erase state E are programmed to erase state E or a LSB program state LP. In this example, erase state E corresponds to a first value of LSB data (e.g., a logical "1"), and program state LP corresponds to a second value of LSB data (e.g., a logical "0").

In a CSB program operation, memory cells in erase state E are programmed to erase state E or a first CSB program state CP1, and memory cells in LSB program state LP are programmed to second or third CSB program states CP2 or CP3. In this example, erase state E and second CSB program state CP2 correspond to a first value of CSB data (e.g., a logical "0"), and program states CP1 and CP3 correspond to a second value of CSB data (e.g., a logical "1").

In a MSB program operation, memory cells in erase state E are programmed to one of erase state E or a first program state P1, memory cells in first CSB program state CP1 are programmed to second or third program states P2 or P3, memory cells in second CSB program state CP2 are programmed to fourth or fifth program states P4 or P5, and memory cells in third CSB program state CP3 are programmed to sixth or seventh program states P6 or P7. In this example, erase state E, and second, fourth and sixth program states P2, P4, and P6 correspond to a first value of MSB data (e.g., a logical "0"), and first, third, fifth and seventh program states P1, P3, P5 and P7 (e.g., a logical "1").

Figure 5:
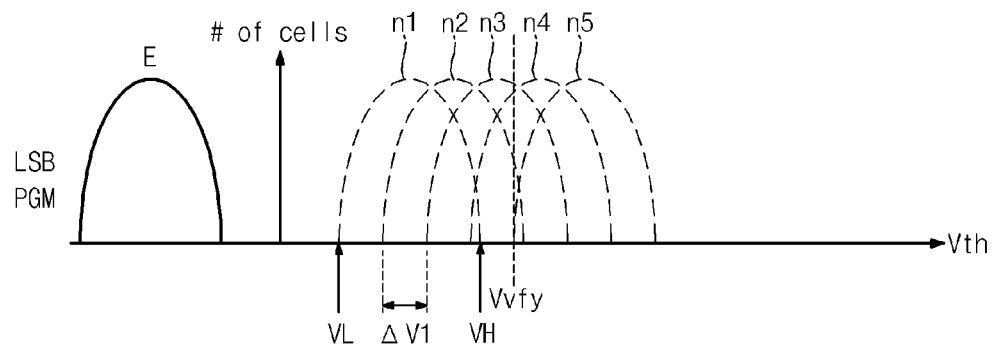
FIG. 5 is a diagram illustrating a method of performing a least significant bit (LSB) program operation of FIG. 4.

FIG. 5 is a diagram illustrating a method of performing the LSB program operation of FIG. 4. The program operation comprises a plurality of program loops, and each program loop comprises a program step and a verify step.

In the program step, a program voltage is applied to selected memory cells to increase their respective threshold voltages. In the verify step, a verify read operation is performed by applying a verify voltage to the selected memory cells and determining whether the respective threshold voltages of the selected memory cells are greater than the verify voltage. Where the threshold voltage of a selected memory cell is greater than the verify voltage, the selected memory cell is deemed to be successfully programmed (program-passed). Otherwise, the selected memory cell is deemed to be insufficiently programmed (program-failed).

In the description that follows, the term "programmed memory cell" refers to a memory cell whose threshold voltage is changed during a program operation, such as a memory cell programmed from erase state E to state LP during LSB programming. Similarly, the term "unprogrammed memory cell" refers to a memory cell whose threshold voltage is not changed during a program operation, such as a memory cell maintained in erase state E during LSB programming.

A first program loop is performed upon initiation of a program operation. In the first program loop, a program step is performed by applying an initial program voltage Vini as a program voltage Vpgm to memory cells. The threshold voltage of programmed memory cells increases in response to initial program voltage Vini. For example, threshold voltages of programmed memory cells change from erase state E to a first distribution state n1 in response to initial program voltage Vini. The threshold voltages of unprogrammed memory cells remain in erase state E.

Thereafter, a verify step is performed. First distribution state n1 is located in a voltage range between a low voltage VL and a high voltage VH. Low voltage VL represents a minimum voltage of first distribution state n1 and high voltage VH represents a maximum voltage of first distribution state n1. In the verify step, a verify voltage Vvfy is used to identify program-passed memory cells. First distribution state n1 corresponds to a voltage range lower than the verify voltage Vvfy, and therefore there are no programmed-passed memory cells in first distribution state n1. Accordingly, the programmed memory cells are determined to be programmed-failed in the first program loop.

Thereafter, a second program loop is performed. The level of program voltage Vpgm is increased in the second program loop by a first voltage difference $\Delta V1$ compared with initial program voltage Vini of the first program loop. In the second program loop, the threshold voltage distribution of programmed memory cells changes from first distribution state n1 to a second distribution state n2. The threshold voltages of some of the memory cells corresponding in second distribution state n2 are higher than verify voltage Vvfy. Thus, some of the memory cells corresponding to second distribution state n2 are determined to be program-passed. The program-passed memory cells are set to be program-inhibited in subsequent program loops. The threshold voltages of other memory cells corresponding to second distribution state n2 are lower than verify voltage Vvfy. Thus, the other memory cells corresponding to second distribution state n2 are determined to be program-failed in the second program loop.

Thereafter, additional program loops are performed until all of the selected memory cells are programmed-passed. In every program loop, the level of program voltage Vpgm increases by first voltage difference $\Delta V1$.

In a third program loop, the threshold voltage distribution of programmed memory cells changes from second distribution state n2 to a third distribution state n3. In a fourth program loop, the threshold voltage distribution of programmed memory cells changes from third distribution state n3 to a fourth distribution state n4. In a fifth program loop, the threshold voltage distribution of programmed memory cells changes from fourth distribution state n4 to a fifth distribution state n5. The threshold voltages of memory cells corresponding to fifth distribution state n5 are higher than verify voltage Vvfy. Thus, programmed memory cells are determined to be program-passed in the fifth program loop, and the program operation is completed.

FIG. 5 shows memory cells that are programmed through five program loops. However, programmed memory cells are not limited to being program-completed through five program loops. For example, programmed memory cells may be program-completed through "j" program loops, where "j" can be any arbitrary number greater than one.

In the first and second program loops of FIG. 5, the threshold voltages of all programmed memory cells increase. Following the second program loop, however, some of the programmed memory cells are program-passed and program-inhibited. In other words, the threshold voltages of the program-passed memory cells do not change.

In some embodiments, the first program loop can be modified by adjusting initial program voltage Vini to the value used in the second program loop. Accordingly, the threshold voltage distribution of programmed memory cells after the first program loop can be modified to correspond to second distribution state n2. By decreasing the number of program loops, the program speed increases. In other words, where initial program voltage Vini is adjusted to allow some (or at least one) of the programmed memory cells to be program-passed in the first program loop, the program speed increases.

As illustrated in FIG. 3, memory cells connected to the same word line correspond to a plurality of pages, such as an LSB page, a CSB page, and an MSB page. In an LSB page program operation, the level of program voltage Vpgm at the occurrence of a first pass event is acquired. The program characteristics of the memory cells connected to the corresponding word line are derived based on the acquired level of program voltage Vpgm. For example, a relationship (e.g., a ratio) between program voltage Vpgm applied to the selected memory cells and the threshold voltage (or the threshold voltage variation) of the selected memory cells is derived. The derived relationship information is used to adjust the level of initial program voltage Vini in the CSB page program operation and the MSB page program operation.

For example, in the CSB page program operation, the initial program voltage can be adjusted to allow at least one of the programmed memory cells to be program-passed in the first program loop, or in the MSB page program operation, the initial program voltage can be adjusted to allow at least one of the programmed memory cells to be program-passed in the first program loop.

The initial program voltages of more significant page program operations (e.g., CSB page programming and MSB page programming) are adjusted based on the level of program voltage Vpgm detected in the first pass event of the LSB page program operation, the difference between the verify voltage levels of the LSB page and the more significant page, and the difference between the program voltage increments of the LSB page and the more significant pages. For example, an adjusted initial program voltage Va may corresponds to a detected program voltage (Vpgm) level minus a verify voltage level difference and a program voltage increment difference.

In the above manner, the LSB page program operation is used to determine various program characteristics of the programmed memory cells. The determined characteristics are then used to adjust initial program voltages Vini of CSB and MSB page program operations. The initial program voltages Vini of the CSB and MSB page program operations are adjusted to allow at least one of the programmed memory cells to be program-passed in a first program loop, thereby increasing the speed of the CSB and MSB page programming operations.

As described with reference to FIG. 5, programming characteristics of memory cells connected to a specific word line are determined by programming the memory cells. As the number of programmed memory cells among memory cells connected to a specific word line increases, the accuracy of the determined program characteristics increases. Similarly, as the number of programmed memory cells among memory cells connected to a specific word line decreases, the accuracy of the determined program characteristics decreases.

Through the process described in relation to FIG. 5, some of the memory cells are classified as slow memory cells. Slow memory cells are memory cells that are less responsive to programming compared with other memory cells. For example, after applying the same program voltage to a normal memory cell and a slow memory cell, the slow memory cell has a lower threshold voltage than the normal memory cell. That is, the threshold voltage of a slow memory cell increases less than the threshold voltage of a normal memory cell. In first distribution state n1 of FIG. 5, for instance, slow memory cells have low threshold voltages close to low voltage VL. Likewise, in each of the second through fifth distribution states n2 through n5, the slow memory cells have threshold voltages at the low end of the threshold voltage distributions.

As the number of programmed memory cells among memory cells connected to a specific word line decreases, the probability of the programmed memory cells comprising slow memory cells increases, and as the number of slow memory cells increases, the accuracy of program characteristics derived from the programmed memory cells decreases.

Figure 6:
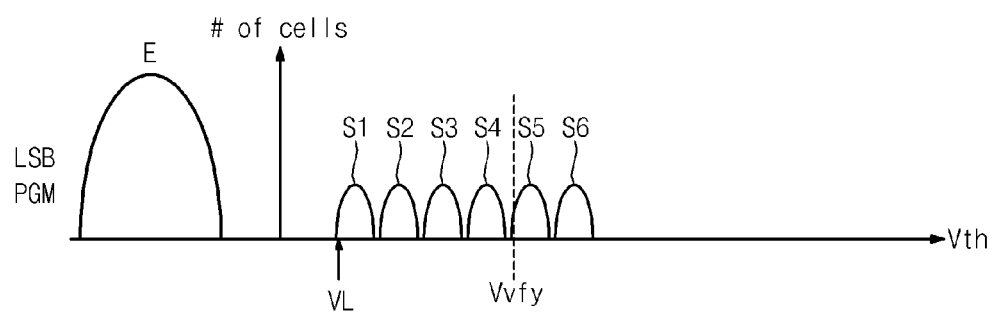
FIG. 6 is a diagram illustrating a method of performing a LSB page program operation where the programmed memory cells comprise slow memory cells.

FIG. 6 is a diagram illustrating a method of performing a LSB page program operation where the programmed memory cells comprise slow memory cells.

Referring to FIG. 6, following a first program loop, the threshold voltage distribution of programmed memory cells (e.g., program-passed memory cells) corresponds to a first slow distribution state s1, and all of the programmed memory cells are program failed. As described with reference to FIG. 5, the first slow distribution state s1 has a threshold voltage adjacent to low voltage VL.

Following a second program loop, the threshold voltage distribution of programmed memory cells corresponds to a second slow distribution state s2, and all of the programmed memory cells are still program failed.

A first pass event does not occur until the threshold voltages of the programmed memory cells reach a fourth slow distribution state s4 after passing through a third slow distribution state s3. The first program pass event occurs where the threshold voltage of the programmed memory cells reaches a fifth slow distribution state s5. The programmed memory cells are program passed when the threshold voltage of the memory cells reaches a sixth slow distribution state s6.

In FIG. 5, the first pass event occurs in a second program loop, and in FIG. 6, the first pass event occurs in a fifth program loop. In every program loop, program voltage Vpgm increases incrementally. Thus, program voltage Vpgm corresponding to the slow memory cells at the occurrence of the first pass event is higher than program voltage Vpgm corresponding to the normal memory cells at the occurrence of the first pass event. Accordingly, adjusted voltage Va determined from programming slow memory cells is higher than adjusted voltage Va determined from programming normal memory cells.

Unfortunately, where programming characteristics are derived from slow memory cells and initial program voltage Vini of more significant pages (CSB or MSB pages) is adjusted by a significant amount, over programming can be produced in more significant page program operation.

As illustrated in FIG. 5, three program loops are performed after the first pass event, resulting in all of the memory cells being program passed. As illustrated in FIG. 6, one program loop is performed until slow memory cells are program-passed after the first pass event. The slow memory cells are programmed at slower speeds than the normal memory cells. Thus, the threshold voltage distribution of the programmed slow memory cells is narrower than the threshold voltage distribution of the programmed normal memory cells. The number of program loops performed between the first pass event and full programming of the slow memory cells is less than the number of program loops performed between the first pass event and full programming of the normal memory cells.

Based on the number of program loops performed between the first pass event and program completion, flash memory device 100 of FIG. 1 validates or invalidates the program characteristics derived from the programmed memory cells. That is, the acquired program characteristics can be disregarded where the number of program loops between the first pass event and program completion is less than a reference value. Initial program voltage Vini for more significant pages is adjusted based on the acquired program characteristics when the number of program loops between the first pass event and the program completion is greater than the reference value.

Figure 7:
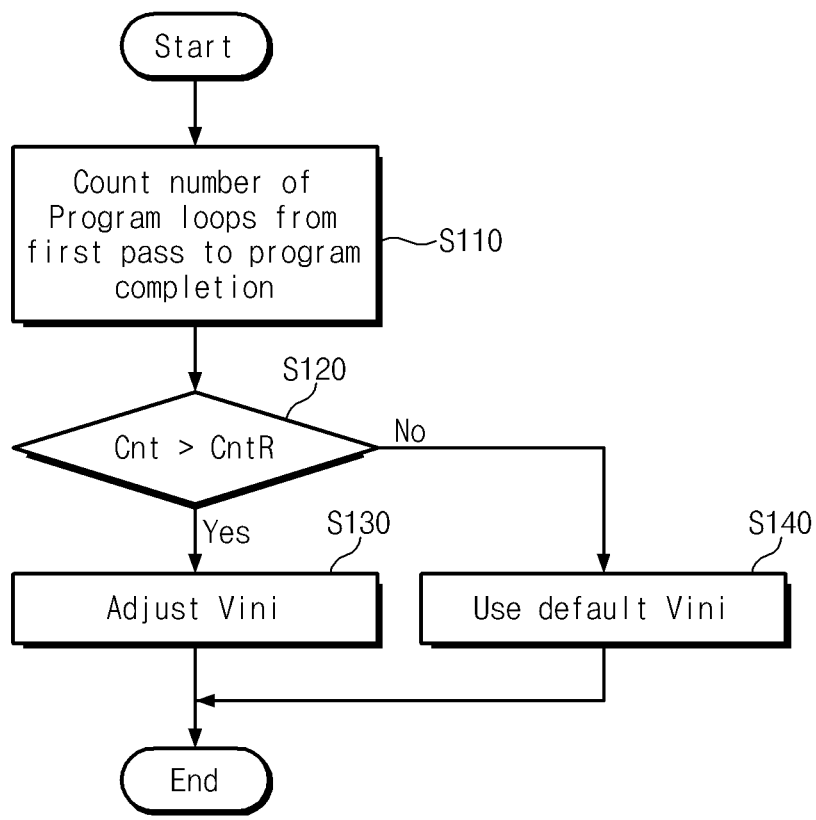
FIG. 7 is a flow chart illustrating a method of operating the flash memory device of FIG. 1.

FIG. 7 is a flow chart illustrating a method of operating flash memory device 100 of FIG. 1.

Referring to FIGS. 1 and 7, the number of program loops between the first pass event and program completion is counted in step S110. The first pass event is detected by PF check circuit 150. Upon detecting the first pass event, PF check circuit 150 activates first pass signal FP. The program completion is detected by PF check circuit 150. Upon detecting the program completion, PF check circuit 150 activates pass signal PASS. In response to first pass signal FP and pass signal PASS, Vini selection unit 163 counts the number of program loops between the first pass event and program completion to generate a count value Cnt.

In step S120, count value Cnt is compared with a reference value CntR. Where count value Cnt is greater than reference value CntR (S120=Yes), initial program voltage Vini is adjusted in step S130. Otherwise, where count value Cnt is less than or equal to reference value CntR (S120=No), the default initial program voltage is used in step S140.

Figure 8:
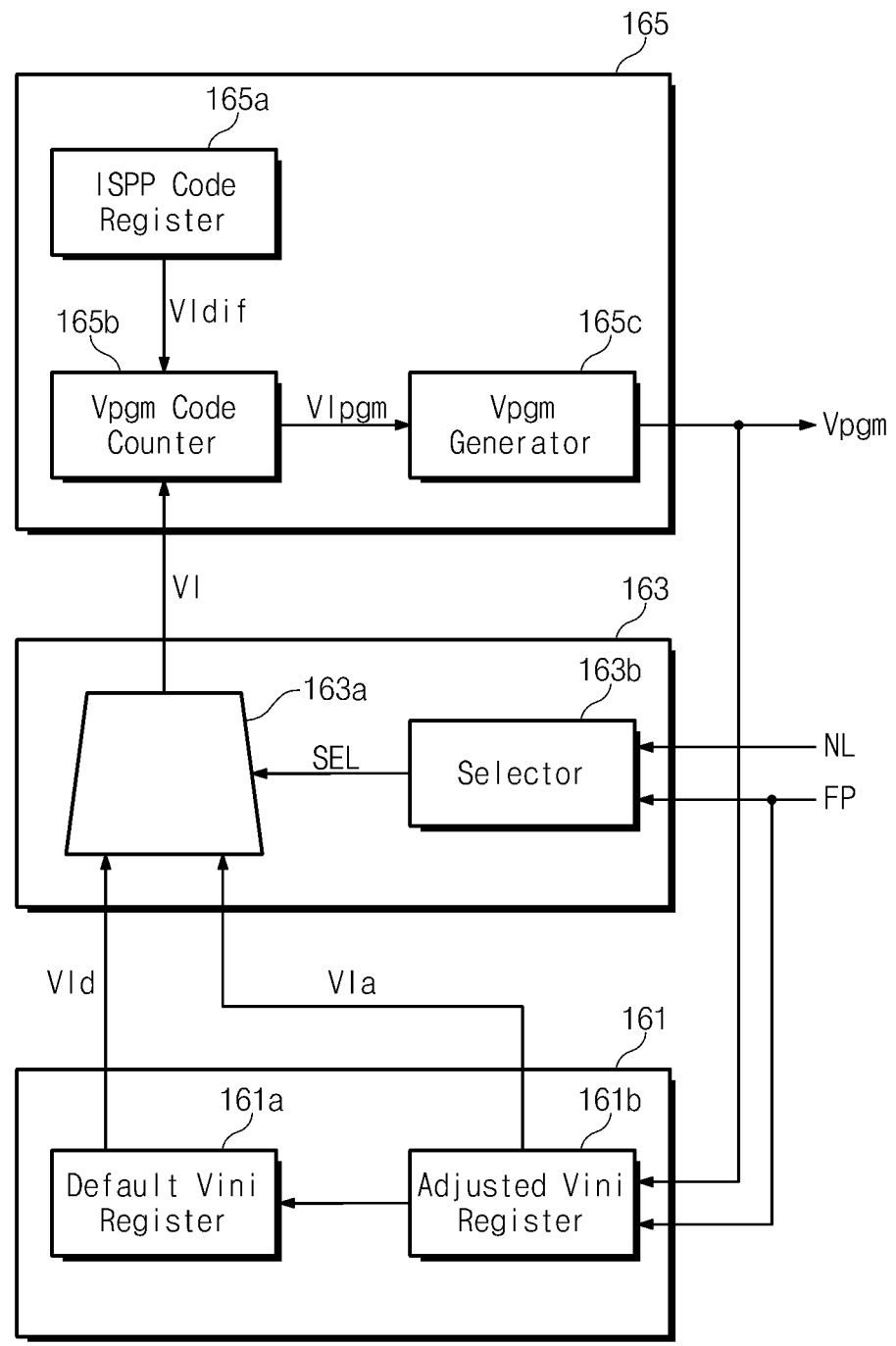
FIG. 8 is a block diagram illustrating embodiments of an initial program voltage Vini storage unit, a Vini selection unit, and a program voltage Vpgm generation unit of FIG. 1.

FIG. 8 is a block diagram illustrating an embodiment of Vini storage unit 161, Vini selection unit 163 and Vpgm generation unit 165 of FIG. 1.

Referring to FIG. 8, Vini storage unit 161 comprises a first register 161a and a second register 161b. First register 161a is configured to store default voltage Vd or default voltage information VId, such as a code representing default voltage Vd.

Second register 161b is configured to store adjusted voltage Va or adjusted voltage information Via, such as a code representing adjusted voltage Va. Second register 161b is configured to store the level (or level information) of program voltage Vpgm in response to first pass signal FP. For example, upon activation of first pass signal FP in response to the first pass event, the level (or the level information) of program voltage Vpgm is stored in second register 161b. The level (or the level information) of program voltage Vpgm is processed to produce adjusted voltage Va or adjusted voltage information Via prior to output from second register 161b.

As described with reference to FIG. 5, initial program voltage Vini of more significant page data is adjusted based on the level of program voltage Vpgm detected at the first pass event of the LSB page program operation, the difference between the verify voltage levels of the LSB page and the more significant page, and the difference between the program voltage increments of the LSB page and the more significant page. Where the received address ADDR corresponds to the CSB page, adjusted voltage Va corresponding to the CSB page is output from second register 161b. Where the received address ADDR corresponds to the MSB page, adjusted voltage Va corresponding to the MSB page is output from second register 161b.

Second register 161b can be configured to receive first pass signal FP directly from PF check circuit 150 or through another component. Second register 161b can be configured to receive program voltage Vpgm directly from Vpgm generation unit 165 or through another component, such as an encoder. The outputs of first and second registers 161a and 161b are provided to Vini selection unit 163.

Vini selection unit 163 comprises a multiplexer 163a and a selector 163b. Multiplexer 163a is configured to receive the outputs of first and second registers 161a and 161b. Multiplexer 163a is further configured to select either adjusted voltage information Via or default voltage information VId output by first and second registers 161a and 161b in response to a selection signal SEL generated by selector 163b, and transfer the selected voltage information VI as Vini information to Vpgm generation unit 165.

Selector 163b is configured to receive first pass signal FP and a next loop signal NL. Next loop signal NL indicates whether to perform a next program loop. Next loop signal NL is activated where a next program loop is to be performed, and deactivated where the next program loop is not to be performed, i.e., where the current program loop is a last program loop. In other words, next loop signal NL is deactivated upon completion of a program operation. Where pass signal PASS is activated, next loop signal NL is deactivated.

Selector 163b increments count value Cnt in response to next loop signal NL and first pass signal FP, and compares count value Cnt with reference value CntR. Selector 163b activates selection signal SEL in response to the comparison results. An embodiment of selector 163b is described in further detail below with reference to FIG. 9.

Vpgm generation unit 165 comprises an ISPP coder register 165a, a Vpgm code counter 165b, and a Vpgm generator 165c. ISPP coder register 165a is configured to store Vpgm increment information VIdif for an ISPP operation. Vpgm increment information VIdif is provided to Vpgm code counter 165b.

Vpgm code counter 165b receives Vpgm increment information VIdif and Vini information VI and generates Vpgm information VIpgm based on the received information. In the first program loop, Vpgm code counter 165b generates Vpgm information VIpgm corresponding to Vini information VI. In subsequent program loops, Vpgm code counter 165b adds Vpgm increment information VIdif to the output of multiplexer 163a to generate Vpgm information VIpgm. Vpgm information VIpgm is transferred to Vpgm generator 165c.

Vpgm generator 165c receives Vpgm information VIpgm and generates program voltage Vpgm based on Vpgm information VIpgm. Vpgm generator 165c typically comprises a trim circuit. The trim of Vpgm generator 165c is controlled in response to Vpgm information VIpgm. Program voltage Vpgm is generated according to the controlled trim.

FIG. 8 illustrates second register 161b configured to receive program voltage Vpgm. However, in a modified embodiment, second register 161b may be configured to receive Vpgm information VIpgm from Vpgm code counter 165b. In other words, second resistor 161b may be configured to store Vpgm information VIpgm when first pass signal FP is activated.

Second resistor 161b is configured to selectively receive program voltage Vpgm or Vpgm information VIpgm. A control signal can be provided to second resistor 161b to control receipt of first pass signal FP and/or program voltage Vpgm. In other words, the control signal first pass signal FP can be provided to second resistor 161b may be interrupted where the control signal is deactivated. In another embodiment, where the control signal is deactivated, second resistor 161b does not receive program voltage Vpgm or Vpgm information VIpgm independent of the state of first pass signal FP.

Figure 9:
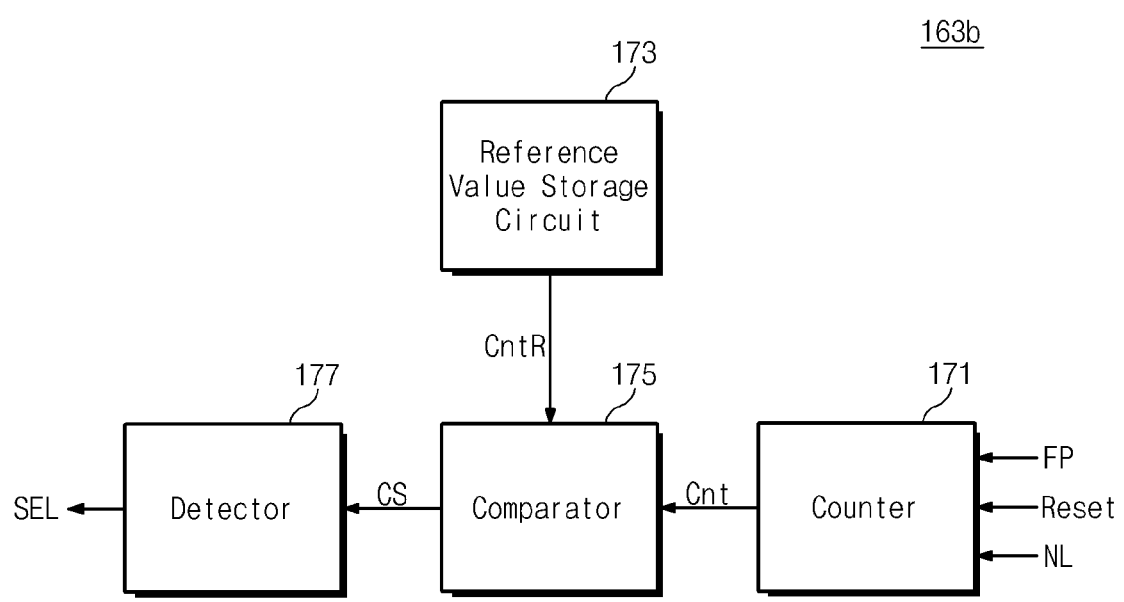
FIG. 9 is a block diagram illustrating an embodiment of a selector of FIG. 8.

FIG. 9 is a block diagram illustrating an embodiment of selector 163b of FIG. 8. Referring to FIG. 9, selector 163b comprises a counter 171, a reference value storage circuit 173, a comparator 175, and a detector 177.

Counter 171 is configured to receive first pass signal FP, a reset signal Reset, and next loop signal NL. Counter 171 performs a count operation while next loop signal NL is activated and begins a count operation in response to first pass signal FP. Count value Cnt of counter 171 is initialized in response to reset signal Reset and is increased in every program loop. Thus, counter 171 counts the number of program loops from the occurrence of the first pass event until the pass of the memory cells. Count value Cnt is provided to comparator 175.

Next loop signal NL remains activated while program loops are performed, and is deactivated upon completion of a program operation. First pass signal FP is activated upon the occurrence of the first pass event so that counter 171 performs counting from the occurrence of the first pass event until the all selected memory cells are successfully programmed.

Reference value storage circuit 173 is configured to store a predetermined reference value CntR. In certain embodiments, reference value storage circuit 173 comprises an electrical fuse. Reference value CntR is provided to comparator 175.

Comparator 175 compares count value Cnt with reference value CntR. Where count value Cnt is greater than reference value CntR, comparator 175 activates a control signal CS. Where count value Cnt is less than reference value CntR, comparator 175 deactivates control signal CS. Control signal CS is provided to detector 177.

Detector 177 is configured to receive control signal CS and an enable signal EN. Detector 177 outputs selection signal SEL in response to control signal CS and enable signal EN. Where enable signal EN is in an activated state, detector 177 outputs selection signal SEL in response to control signal CS. Where control signal CS is in an activated state, selection signal SEL indicates second register 161b of FIG. 8. Where control signal CS is in a deactivated state, selection signal SEL indicates first register 161a of FIG. 8. In other words, where count value Cnt is greater than reference value CntR, adjusted voltage Va is selected as initial program voltage Vini. Where count value Cnt is less than reference value CntR, default voltage Vd is selected as initial program voltage Vini.

Where enable signal EN is in a deactivated state, detector 177 controls selection signal SEL to indicate first register 161a independent of control signal CS. Accordingly, where enable signal EN is in a deactivated state, default voltage Vd is selected as initial program voltage Vini.

Enable signal EN is deactivated in the LSB page program operation. Accordingly, default voltage Vd is selected as initial program voltage Vini in the LSB page program operation. Enable signal EN is activated in the program operation for other pages (e.g., the CSB and MSB pages). Accordingly, initial program voltage Vini is selected according to count value Cnt and reference value CntR in the program operations for the other pages.

In some embodiments, enable signal EN may be deactivated by a user so that default voltage Vd is used throughout program operations. Enable signal EN can be deactivated, for instance, using a mode register set MRS controlled by the user.

In some embodiments, counter 171 and comparator 175 are enabled and disabled independent of each other. This can be accomplished, for instance, by providing an enable control signal to each of counter 171 and comparator 175. Counter 171 can be disabled by interrupting next loop signal NL or first pass signal FP provided to counter 171.

Figure 10:
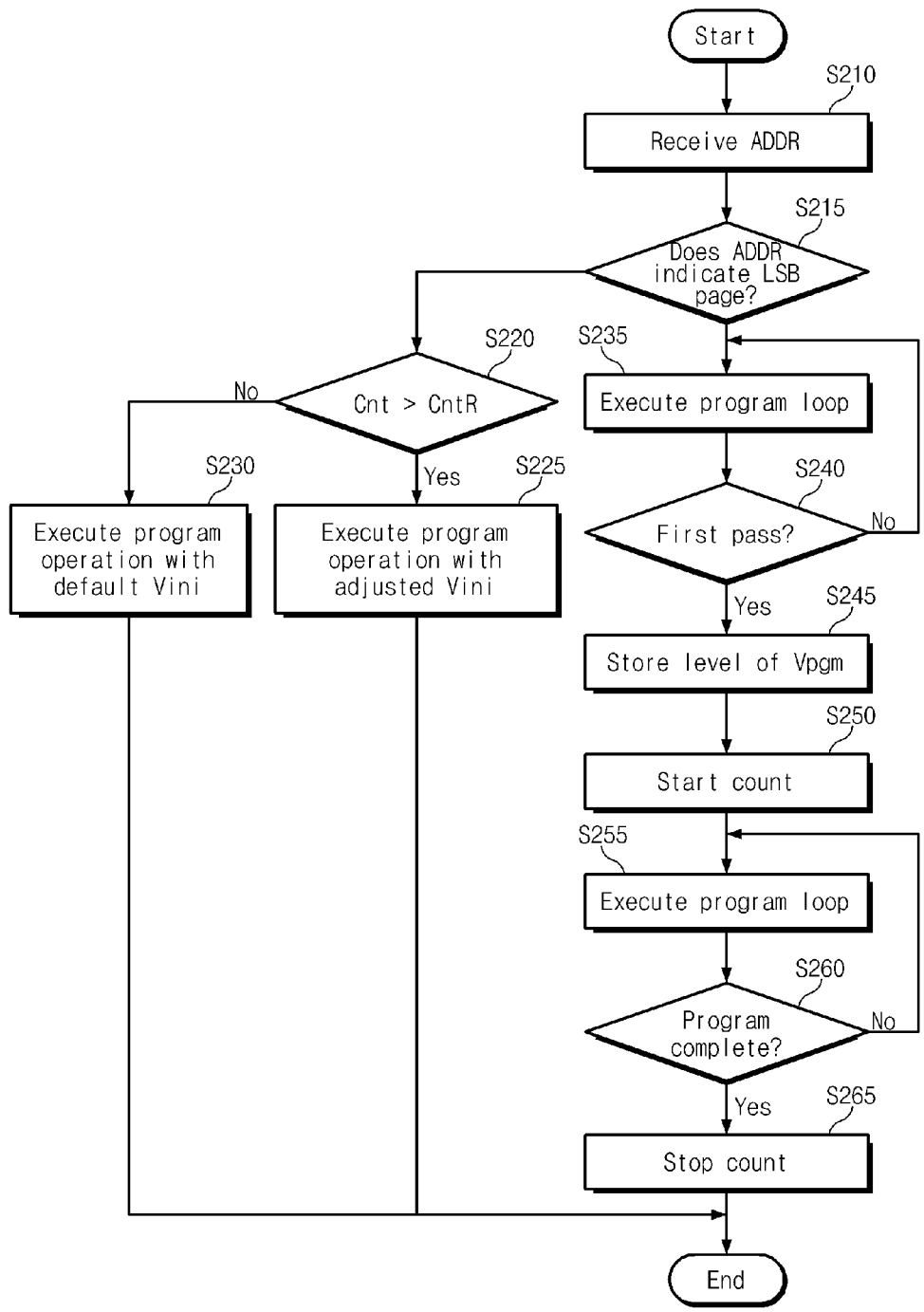
FIG. 10 is a flow chart illustrating a method of operating the flash memory device of FIGS. 1, 8 and 9.

FIG. 10 is a flow chart illustrating a method of operating flash memory device 100 in accordance with the embodiments of FIGS. 1, 8 and 9. Referring to FIGS. 1, 8, 9 and 10, an address ADDR is received in a step S210. Next, a step S215 determines whether the received address ADDR indicates the LSB page. Where the received address ADDR indicates the LSB page, the method proceeds to step 235.

In step S235, a program loop is performed using the initial program voltage. As described with reference to FIG. 9, enable signal EN is activated during LSB page programming. Thus, multiplexer 163a transfers default voltage information VId to Vpgm generator 165c, and the default voltage is used as the initial program voltage in the LSB page program operation.

In step S240, it is determined whether the first pass event occurs. Where the first pass event occurs (S240=Yes), PF check circuit 150 activates first pass signal FP and the method proceeds to step S245. Where the first pass event does not occur (S240=No), the method returns to step S235 and the program loop is performed with an increased program voltage. The level of program voltage Vpgm increases by first voltage difference $\Delta V1$ in each program loop after the first program loop. In other words, an ISPP operation is performed.

In step S245, the level of program voltage Vpgm is stored. Vpgm information VIpgm or program voltage Vpgm at the occurrence of the first pass event is stored in second register 161b in response to first pass signal FP.

In step S250, a count is started. Counter 171 of selector 163b starts the count in response to first pass signal FP. In step S255, further program loops are performed. Like step S235, the level of program voltage Vpgm increases by first voltage difference $\Delta V1$ in program loops performed in step S255.

In step S260, it is determined whether the program operation is completed. Where the program operation is not completed (S260=No), the method returns to step S255 to perform another program loop. On the other hand, where the program operation is completed (S260=Yes), the method proceeds to step S265. In step S265, the count is stopped. Where the program operation is completed, pass signal PASS is activated. Where pass signal PASS is activated, next loop signal NL is deactivated. Where next loop signal NL is deactivated, counter 171 stops the count. Thereafter, the LSB page program operation is completed.

Counter 171 and second register 161b are enabled in the LSB page program operation. Upon occurrence of the first pass event, Vpgm information VIpgm of program voltage Vpgm is stored as adjusted voltage information VIa in second register 161b. Also, the number of the program loops from the occurrence of the first pass event until completion of the program operation is stored in counter 171.

Comparator 175 is typically disabled in the LSB page program operation so that count value Cnt is not compared with reference value CntR in the LSB page program operation.

The method of FIG. 10 is also performed for a CSB page program operation. In step S210 of the CSB program operation, an address ADDR is received. Next, in step 215, it is determined that the received address ADDR does not indicate the LSB page, so the method proceeds to step S220.

In step S220, it is determined whether count value Cnt is greater than reference value CntR. Where count value Cnt is greater than reference value CntR (S220=Yes), the method proceeds to step S225. In step S225, the adjusted initial program voltage Va is used to perform the program operation. That is, it is determined that the program characteristics derived in the LSB page program operation are not derived from slow cells. Initial program voltage Vini is adjusted according to the derived program characteristics. Adjusted voltage Va is used to perform the CSB page program operation.

Where count value Cnt is not greater than reference value CntR (S220=No), the method proceeds to step S230. In step S230, default initial program voltage Vd is used to perform the program operation. That is, it is determined that the program characteristics derived in the LSB page program operation are derived from the slow cells, and the derived program characteristics are disregarded.

The method of FIG. 10 is used to perform an MSB page program operation in the same manner as the CSB page program operation. Counter 171 does not perform counting in program operations for pages other than LSB pages. Accordingly, the clock signal and the input signal provided to counter 171 can be interrupted or disabled in such program operations.

Second register 161b does not generally receive program voltage Vpgm or Vpgm information VIpgm in program operations for pages other than LSB pages. Vpgm information VIpgm or program voltage Vpgm provided to second register 161b is interrupted. Second register 161b maintains the stored program voltage Vpgm or Vpgm information VIpgm. That is, the program characteristics are derived only from the LSB page.

Count value Cnt can be reset after the MSB page programming is completed on memory cells connected to a particular word line.

As indicated above, certain program characteristics of programmed memory cells are determined in an LSB page program operation. The accuracy of the derived program characteristics is determined based on the number of the program loops between the program pass and the program completion. Where the accuracy of the derived program characteristics is deemed low (i.e., where the number of the program loops is less than a reference value), the derived program characteristics are disregarded. Where the accuracy of the derived program characteristics is deemed high (i.e., where the number of the program loops is greater than the reference value), the initial program voltage adjusted in light of the derived program characteristic is used to program memory cells. The use of the adjusted voltage can increase programming speed while maintaining reliability.

Figure 11:
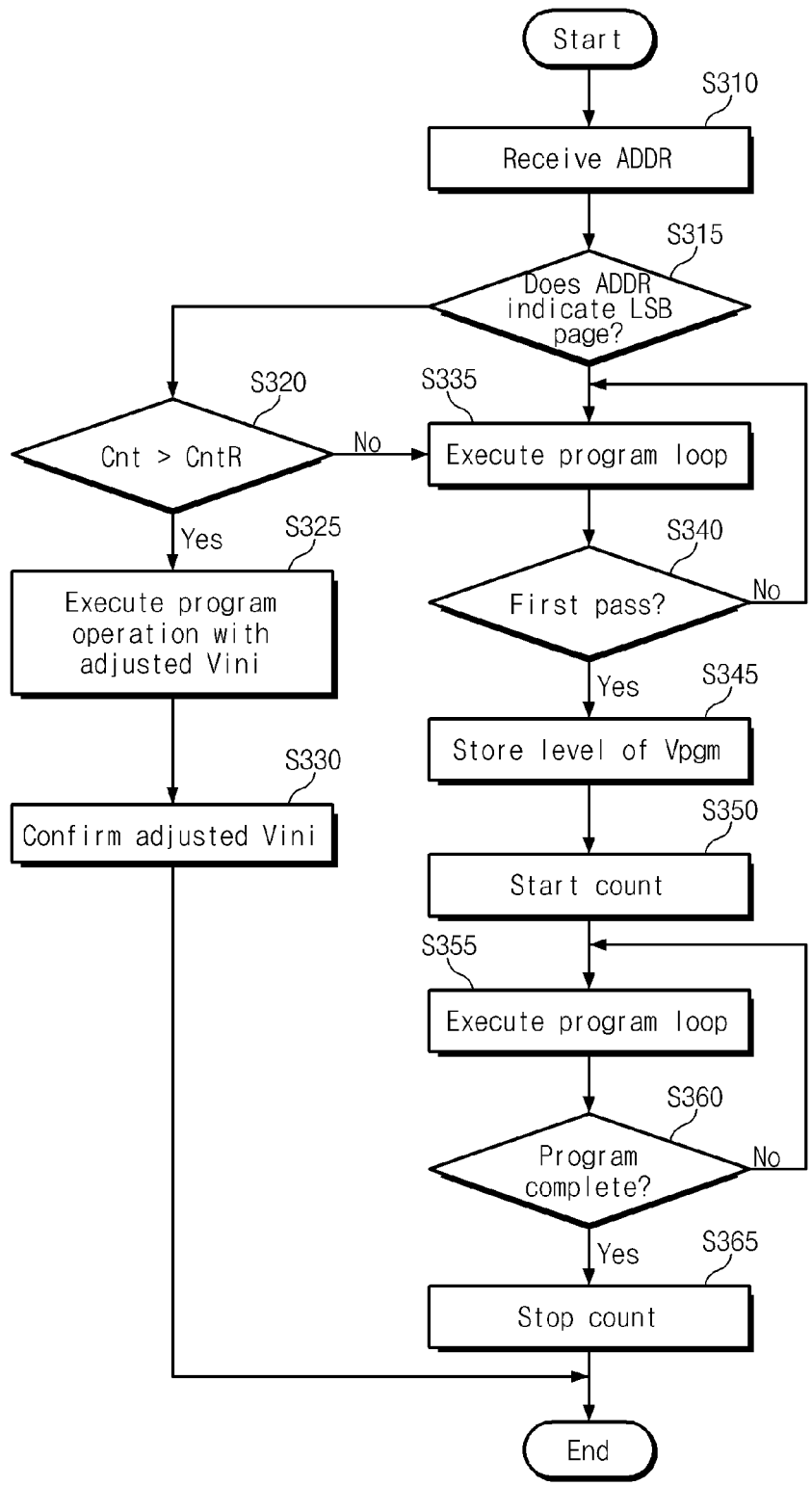
FIG. 11 is a flow chart illustrating a modified embodiment of the method of FIG. 10.

FIG. 11 is a flow chart illustrating a modified embodiment of the method of FIG. 10. Referring to FIG. 11, steps S310, S315, and S335 through S365 are the same as steps S210, S215 and S235 to S265 of FIG. 10. In other words, the LSB page program operation is performed in the same way as described with reference to FIG. 10. Thus, a detailed description thereof will be omitted to avoid redundancy.

In step S315, where the received address ADDR does not indicate the LSB page, the method proceeds to step S320. In step S320, it is determined whether count value Cnt is greater than reference value CntR. Where count value Cnt is greater than reference value CntR (S320=Yes), the method proceeds to step S325. In step S325, the adjusted initial program voltage Va is used to perform the program operation. In step S330, the adjusted initial program voltage Va is determined. That is, counter 171 is deactivated, and second register 161b does not receive program voltage Vpgm or Vpgm information VIpgm.

Where count value Cnt is not greater than reference value CntR (S320=No), the method proceeds to step S335. Accordingly, where the program characteristics are not derived in the specific page program operation, derivation of the program characteristics is attempted again in the program operation for the more significant pages.

Where the program characteristics are derived in the specific page program operation because count value Cnt is greater than reference value CntR, the acquired program characteristics are used to adjust initial program voltage Vini. Adjusted voltage Va is then used to perform the program operation for the more significant pages. In other words, count value Cnt is compared with reference value CntR, and count value Cnt and second register 161b are initialized if count value Cnt is less than reference value CntR.

In some embodiments, where count value Cnt reaches reference value CntR, the clock signal or the input signal provided to counter 171 is interrupted and maintains the stored count value Cnt. Also, second register 161b disregards program voltage Vpgm or Vpgm information VIpgm and Vpgm information VIpgm or program voltage Vpgm provided to second register 161b is interrupted. Second register 161b maintains the stored program voltage Vpgm or Vpgm information VIpgm.

Figure 12:
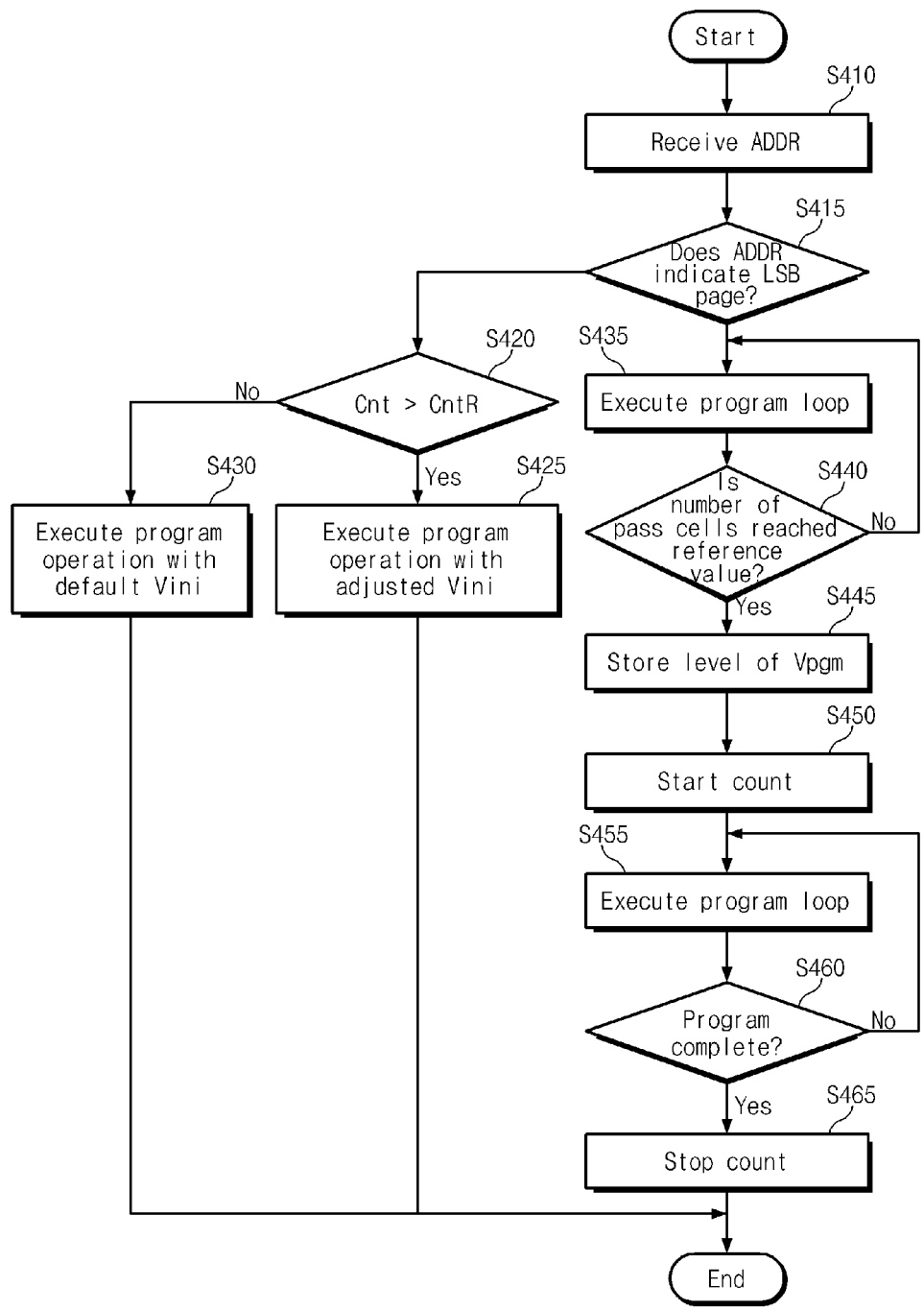
FIG. 12 is a flow chart illustrating another modified embodiment of method of FIG. 10.

FIG. 12 is a flow chart illustrating another modified embodiment of the method of FIG. 10. Referring to FIG. 12, steps S410 through S430 are performed in the same way as steps S210 through S230 of FIG. 10. That is, the program operation for the more significant page of the LSB page is performed in the same way as described with reference to FIG. 10.

The LSB page program operation of FIG. 12 is substantially identical to the LSB page program operation of FIG. 10. Steps S415, S435 and S465 of FIG. 12 are identical to steps S215, S235 and S265 of FIG. 10, but step 440 of FIG. 12 is different from step 240 of FIG. 10.

Step S240 of FIG. 10 determines whether the first pass event occurs. Step S440, on the other hand, determines whether the number of pass memory cells reaches the reference value. That is, even where the first pass event occurs, if the number of the successfully programmed ("pass") memory cells is less than the reference value, the program loop of step S435 is again performed. Where the number of the pass memory cells reaches the reference value, the method proceeds to step S445, where Vpgm information VIpgm or program voltage Vpgm at the time where the number of the pass memory cells reaches the reference value is stored in second register 161b. Due to this difference between step S240 and step S440, the level of adjusted voltage Va of FIG. 12 is equal to or higher than the level of adjusted voltage Va of FIG. 10.

In the embodiment of FIG. 12, pass memory cells, between occurrence of the first pass event and the time where the number of the pass memory cells reaches the reference value, may be over-programmed in the more significant bit program operation. However, where the reference value is set to be less than the number of error-correctable bits of flash memory device 100 or a controller of flash memory device 100, an over-program error can be corrected. Accordingly, programming speed is increased by increasing the level of adjusted voltage Va, and over-programming is prevented by using a reference value less than the number of error-correctable bits. In this embodiment, PF check circuit 150 or control logic circuit 160 determines whether the number of the pass memory cells reaches the reference value.

Figure 13:
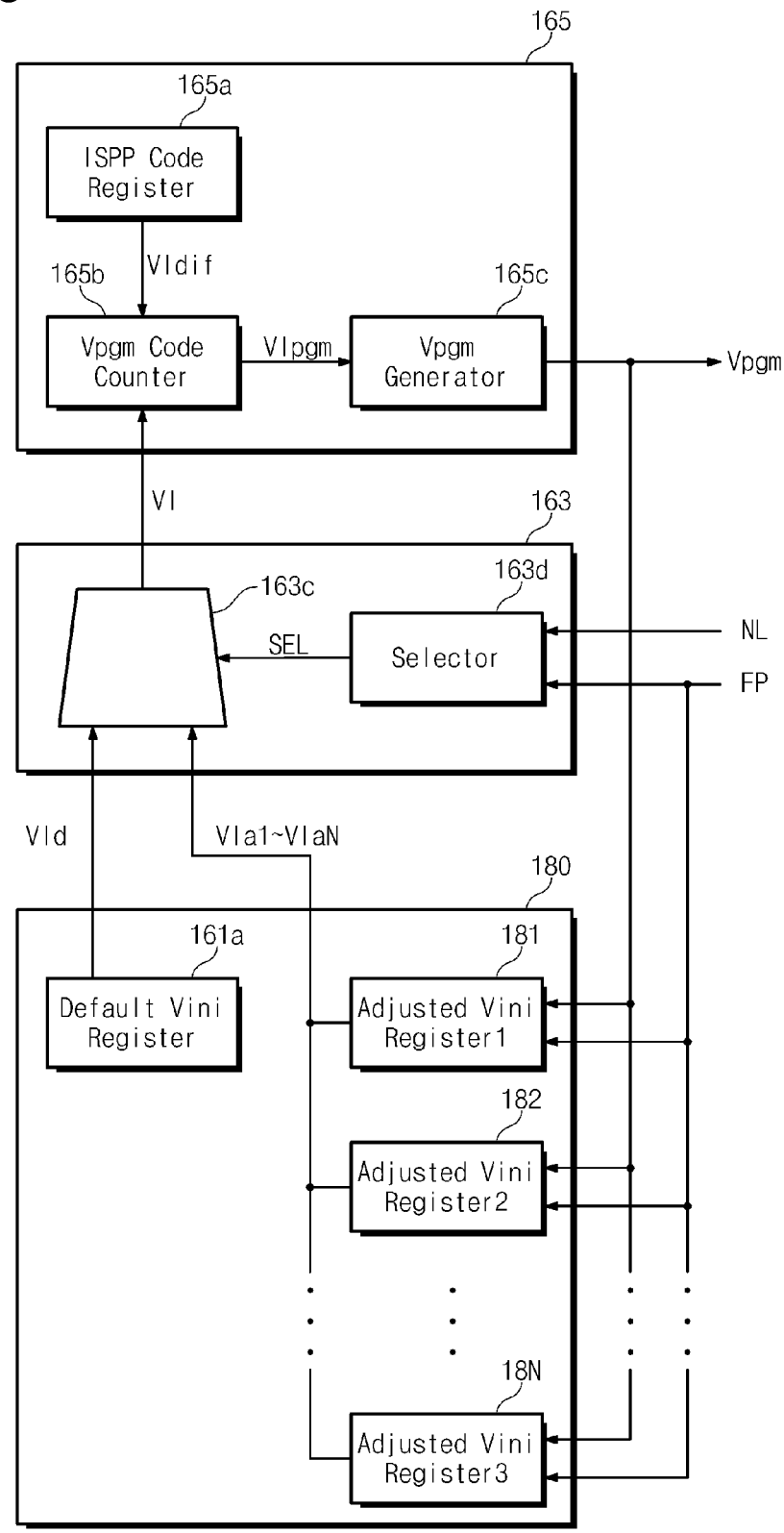
FIG. 13 is a block diagram illustrating a modified embodiment of the Vini storage unit, the Vini selection unit, and the Vpgm generation unit of FIG. 8.

FIG. 13 is a block diagram illustrating a modified embodiment of Vini storage unit 161, Vini selection unit 163 and Vpgm generation unit 165 of FIG. 8.

Referring to FIG. 13, a Vini storage unit 180 comprises a first register 161a and a plurality of second registers 181 through 18N. Second registers 181 through 18N are configured to store the adjusted Vini information Va1 through VaN of the corresponding pages, respectively.

A multiplexer 163c of Vini selection unit 163 selects one of first register 161a and second registers 181 through 18N in response to a selection signal SEL of a selector 163d.

The output of first register 161a is typically selected where count value Cnt is less than reference value CntR. The output of the register corresponding to the programmed word line, among second registers 181 through 18N, is selected where count value Cnt is greater than reference value CntR. Accordingly, the program characteristics derived from the first word line can be maintained where the page connected to the second word line is programmed before the LSB to MSB pages connected to the first word line are all programmed.

In certain embodiments, a plurality of counters corresponding to respective second registers 181 through 18N are provided in the selector 163d. Also, where a specific word line is programmed, count value Cnt of the counter corresponding to the specific word line is compared with reference value CntR.

In certain embodiments, a storage circuit is provided to store the count values Cnt1 through CntN corresponding to second registers 181 through 18N. Where the LSB page of a specific word line is programmed, count value Cnt corresponding to the specific word line is stored in the corresponding storage circuit. Also, where the more significant page of the specific word line is programmed, count value Cnt stored in the storage circuit corresponding to the specific word line is compared with reference value CntR.

In some embodiments, count value Cnt is compared with reference value CntR, and reference value CntR is set by a user. In other embodiments, the program characteristics of the memory cell array are tested, and reference value CntR is set according to the test results. In still other embodiments, reference value CntR is programmed in a mode set register.

In some embodiments, nonvolatile memory device 100 is a flash memory device. However, the inventive concept is not limited to flash memory devices. For example, certain embodiments of the inventive concept comprise volatile memory devices, such as SRAMs, DRAMs and SDRAMs, and nonvolatile memory devices such as ROMs, PROMs, EPROMs, EEPROMs, flash memory devices, PRAMs, MRAMs, RRAMs and FRAMs. Additionally, in some embodiments, measurements of program voltages can be replaced by program currents, and in some embodiments, measurements of threshold voltages can be replaced by measurements of resistance values.

Figure 14:
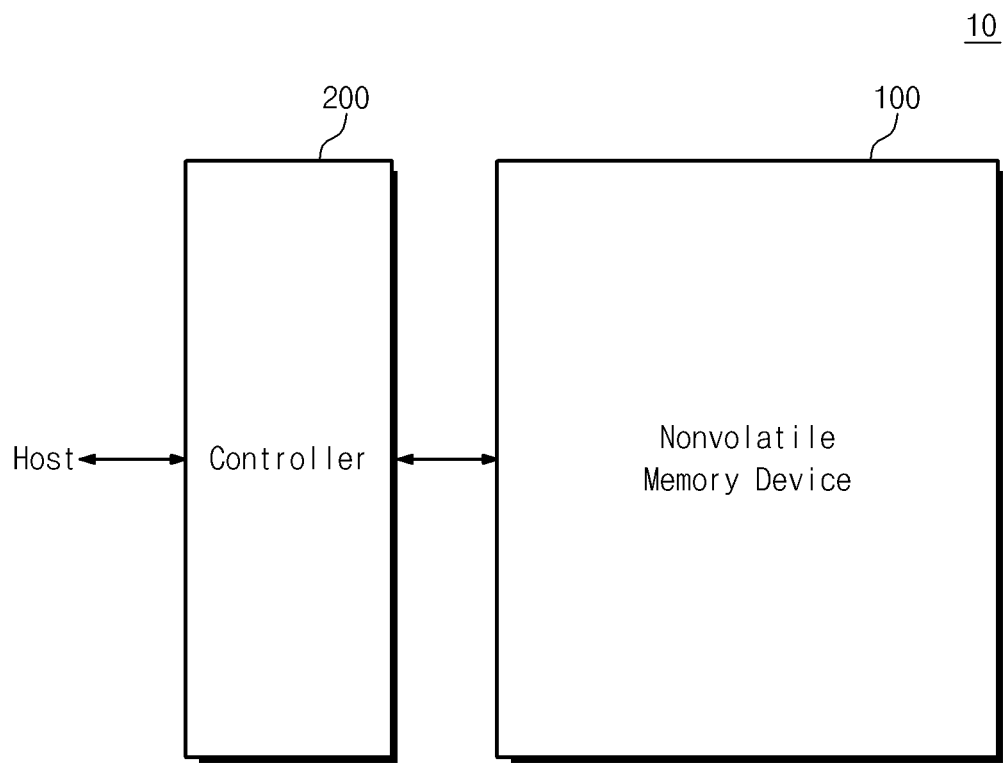
FIG. 14 is a block diagram of a memory system incorporating the nonvolatile memory device of FIG. 1.

FIG. 14 is a block diagram of a memory system 10 comprising nonvolatile memory device 100 of FIG. 1 according to an embodiment of the inventive concept.

Referring to FIG. 14, memory system 10 comprises nonvolatile memory device 100 and a controller 200. Controller 200 is connected to a host and nonvolatile memory device 100. Controller 200 is configured to access nonvolatile memory device 100 in response a request from the host. Controller 200 is typically configured to control read, write, erase, and background operations of nonvolatile memory device 100. The controller 200 is also configured to provide an interface between nonvolatile memory device 100 and the host, and to drive firmware for controlling nonvolatile memory device 100.

In some embodiments, controller 200 provides a control signal CTRL and an address ADDR to nonvolatile memory device 100 and exchanges data with nonvolatile memory device 100. In some embodiments, controller 200 comprises a random access memory, a processing unit, a host interface, and a memory interface. The RAM can be used as at least one of a working memory of the processing unit, a cache memory between nonvolatile memory device 100 and the host, and a buffer memory between nonvolatile memory device 100 and the host. The processing unit controls the overall operation of controller 200.

The host interface implements a protocol for data exchange between the host and controller 200. Controller 200 can be configured to communicate with one or more external devices, such as the host, through one of various interface protocols such as universal serial bus (USB), multimedia card (MMC), peripheral component interface (PCI), PCI-Express (PCI-E), advanced technology attachment (ATA), serial-ATA, parallel-ATA, small computer small interface (SCSI), enhanced small disk interface (ESDI), and integrated drive electronics (IDE). The memory interface interfaces with nonvolatile memory device 100. The memory interface may comprise, for instance, a NAND interface or a NOR interface.

Memory system 10 may further include an error correction block using error correction codes to detect and correct an error in data read from nonvolatile memory device 100. In certain embodiments, the error correction block is provided as a component of controller 200 or as a component of nonvolatile memory device 100.

In some embodiments, controller 200 and nonvolatile memory device 100 are integrated into a single semiconductor device. As an example, controller 200 and nonvolatile memory device 100 can be integrated into one semiconductor device to constitute a memory card, such as a PC card, a compact flash card, a smart media card, a memory stick, a multimedia card, an SD card, or a universal flash storage device.

As another example, controller 200 and nonvolatile memory device 100 can be integrated into a single semiconductor device to constitute a solid state drive (SSD), where the SSD comprises a storage device configured to store data in a semiconductor memory. Where memory system 10 is used as an SSD, the operating speed of the host connected to memory system 10 may increase.

As another example, memory system 10 may be incorporated in any of various consumer or industrial electronic devices, such as computers, portable computers, laptop computers, Ultra Mobile PCs (UMPCs), net-books, PDAs, web tablets, wireless phones, mobile phones, smart phones, e-books, Portable Multimedia Players (PMPs), portable game devices, navigation devices, black boxes, digital cameras, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, one of various components constituting a computing system, or one of various components of a electronic device.

Nonvolatile memory device 100 or memory system 10 can be mounted in various types of packages. Examples of packages for nonvolatile memory device 100 or memory system 10 include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

Figure 15:
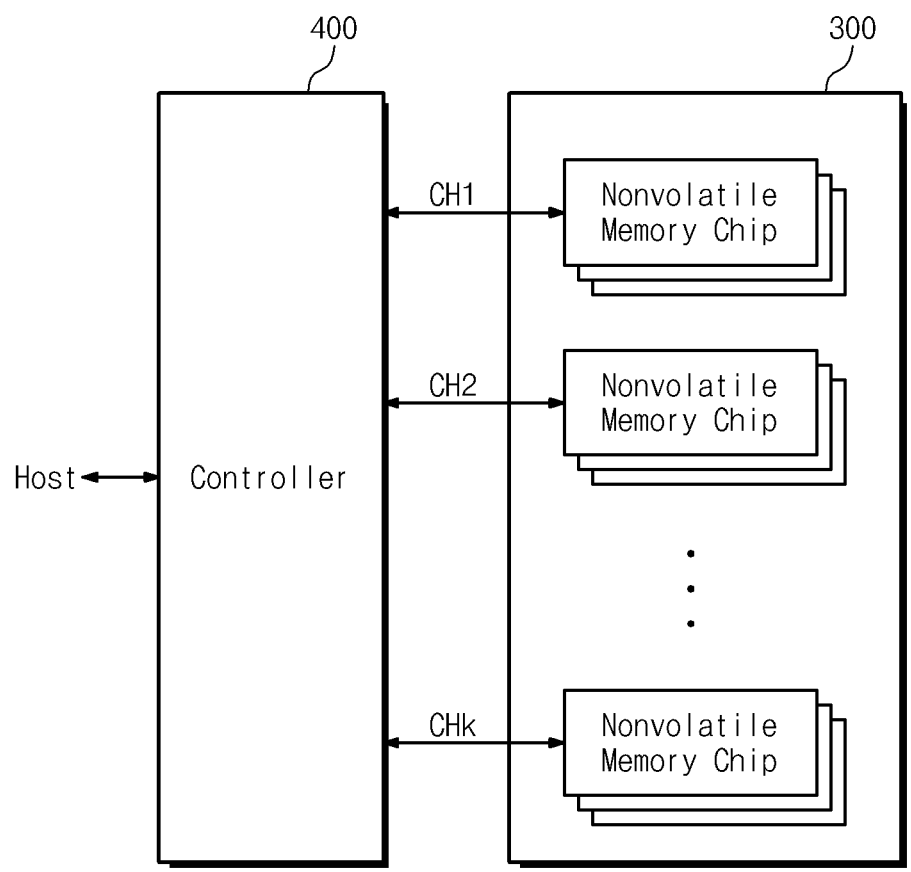
FIG. 15 is a block diagram illustrating a modified embodiment of the memory system of FIG. 14.

FIG. 15 is a block diagram illustrating a modified embodiment of memory system 10 of FIG. 14.

Referring to FIG. 15, a memory system 20 comprises a nonvolatile memory device 300 and a controller 400. Nonvolatile memory device 300 comprises a plurality of nonvolatile memory chips divided into a plurality of groups. Each group of the nonvolatile memory chips is configured to communicate with controller 400 through a common channel. In particular, in FIG. 15 the nonvolatile memory chips communicate with controller 400 through first to $k^{th}$ channels CH1 through CHk. Each nonvolatile memory chip is configured similar to nonvolatile memory device 100 of FIG. 1, and controller 400 is configured similar to controller 200 of FIG. 14.

Figure 16:
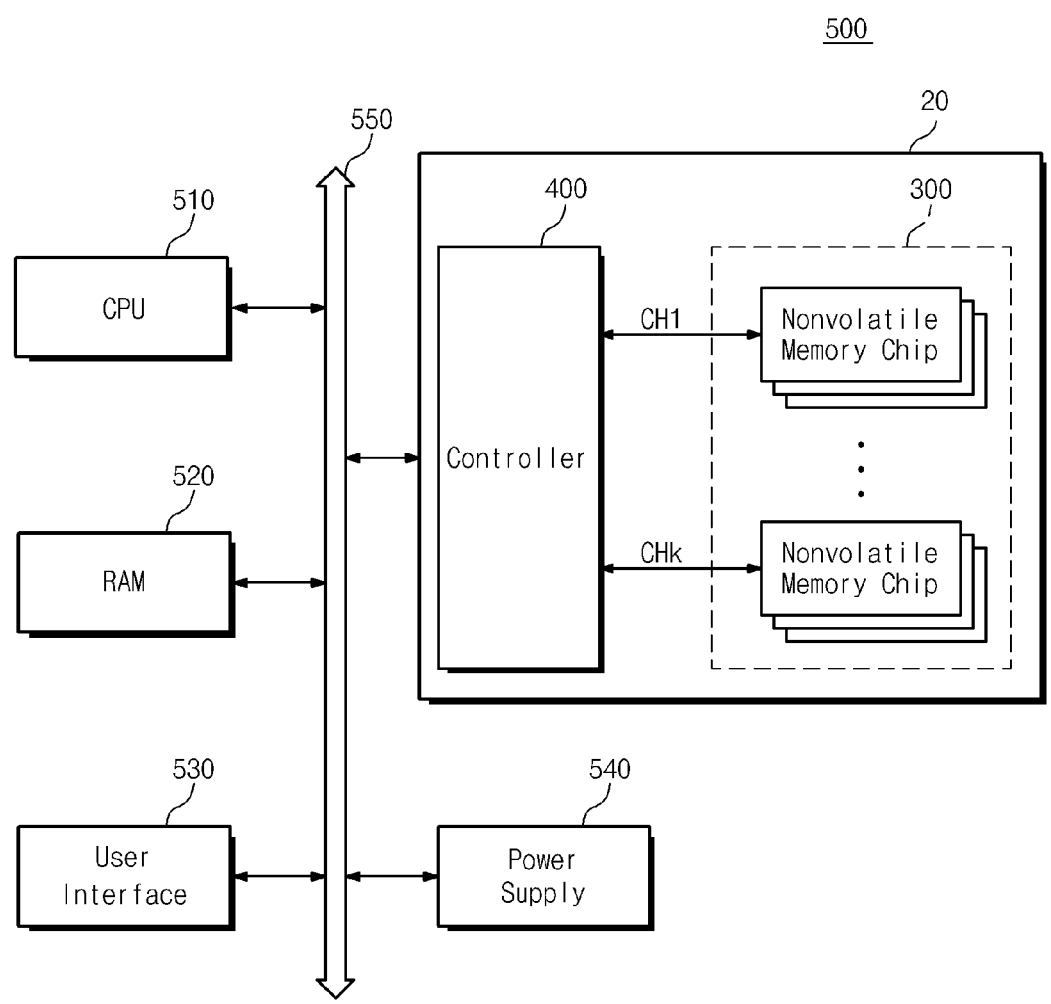
FIG. 16 is a block diagram of a computing system incorporating the memory system of FIG. 15.

FIG. 16 is a block diagram of a computing system 500 comprising memory system 20 of FIG. 15 according to an embodiment of the inventive concept.

Referring to FIG. 16, computing system 500 comprises a central processing unit 510, a RAM 520, a user interface 530, a power supply unit 540, and a memory system 20.

Memory system 20 is electrically connected to CPU 510 via a system bus 550, RAM 520, user interface 530 and power supply unit 540. Data provided through user interface 530 or processed by CPU 510 is stored in memory system 20. Memory system 20 comprises a nonvolatile memory device 300 and a controller 400.

FIG. 16 shows nonvolatile memory device 300 connected to system bus 550 via controller 400. However, nonvolatile memory device 300 can be connected directly to system bus 550, with the function of controller 400 performed by CPU 510. FIG. 16 also illustrates memory system 20 of FIG. 15 provided in computing system 500. However, memory system 20 may be replaced by memory system 10 of FIG. 14. Moreover, in some embodiments, computing system 500 can be configured to include both of the memory systems 10 and 20 of FIGS. 14 and 15.

According to selected embodiments of the inventive concept described above, programming characteristics and related accuracy parameters are measured in LSB program operations. Then, in more significant page program operations, an initial program voltage is adjusted based on the programming characteristics and the accuracy parameters. Thus, it is possible to provide a nonvolatile memory device having increased operating speed while maintaining reliability, as well as methods of operating the nonvolatile memory device and memory systems comprising the nonvolatile memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of operating a nonvolatile memory device, comprising:
executing a first programming of a plurality of memory cells using repeated program loops until at least one memory cell of the plurality of memory cells is program-passed;
executing a second programming of the plurality of memory cells using repeated program loops until all memory cells of the plurality of memory cells are program-passed, and counting a number of the repeated program loops in the second programming to provide a count value; and
adjusting an initial program voltage to be used in subsequent programming of the plurality of memory cells based on the count value.

2. The method of claim 1, wherein adjusting the initial program voltage is performed upon determining that the count value is greater than a reference value.

3. The method of claim 2, wherein the initial program voltage is adjusted according to a level of a program voltage used in a program loop where the at least one memory cell is program-passed.

4. The method of claim 1, wherein each of the memory cells is configured to store "n" bits, and adjusting the initial program voltage comprises adjusting the initial program voltage for programming $(k+1)^{th}$ through $n^{th}$ bits in the memory cells based on the count value after a least significant bit (LSB) through $k^{th}$ bits are programmed in the memory cells.

5. The method of claim 1, wherein each of the memory cells is configured to store "n" bits, and adjusting the initial program voltage comprises adjusting the initial program voltage for programming $(k+1)^{th}$ bits in the memory cells based on the count value after a least significant bit (LSB) through $k^{th}$ bits are programmed in the memory cells.

6. The method of claim 1, wherein the initial program voltage is adjusted independently for different word lines of the nonvolatile memory device.

7. The method of claim 1, wherein the first programming is executed until a predetermined number of memory cells among the plurality of memory cells is program-passed.

8. A nonvolatile memory device, comprising:
a memory cell array;
a read/write circuit configured to access the memory cell array; and
a control logic circuit configured to provide a program voltage to the memory cell array and control a program operation performed by repeated program loops,
wherein the control logic circuit is configured to adjust an initial program voltage used during the program operation based on a number of program loops performed between detection of at least one program-passed memory cell and completion of a prior program operation.

9. The nonvolatile memory device of claim 8, wherein the control logic circuit is configured to provide a default initial program voltage to the memory cell array where the number of the program loops is less than a reference value.

10. The nonvolatile memory device of claim 8, wherein the control logic circuit is configured to adjust the initial program voltage where the number of the program loops is greater than a reference value.

11. The nonvolatile memory device of claim 10, wherein the control logic circuit is configured to adjust the initial program voltage according to a level of a program voltage upon detection of the at least one program-passed memory cell.

12. The nonvolatile memory device of claim 8, wherein each memory cell in the memory cell array is configured to store "n" bits, and the control logic circuit is configured to adjust the initial program voltage for programming $(k+1)^{th}$ through $n^{th}$ bits in the memory cells based on a number of the program loops performed to program a least significant bit (LSB) through $k^{th}$ bits in the memory cells.

13. The nonvolatile memory device of claim 8, wherein each memory cell in the memory cell array is configured to store "n" bits, and the control logic circuit is configured to adjust the initial program voltage for programming $(k+1)^{th}$ bits in the memory cells based on a number of program loops performed to program a least significant bit (LSB) through $k^{th}$ bits in the memory cells.

14. The nonvolatile memory device of claim 8, wherein the initial program voltage is adjusted independently for different word lines of the nonvolatile memory device.

15. The nonvolatile memory device of claim 8, wherein the control logic circuit is configured to count a number of program loops performed between detection of the at least one program-passed memory cell and completion of the program operation reaches a predetermined value.

16. The nonvolatile memory device of claim 8, wherein the control logic circuit comprises:
   a first register configured to store at least one default initial program voltage; and
   a second register configured to store at least one adjusted initial program voltage,
   wherein a level of a program voltage at the detection of the at least one program-passed memory cell is stored in the second register.

17. The nonvolatile memory device of claim 16, wherein the control logic circuit further comprises:
   a counter configured to start a count operation upon detection of the at least one program-passed memory cell and to increment a count value in subsequent program loops;
   a storage circuit configured to store the reference value;
   a comparator comparing the count value with the reference value to generate a selection signal; and
   a multiplexer configured to select an output of the first register or an output of the second register in response to the selection signal,
   wherein the output of the second register is selected where the count value is greater than the reference value.

18. The nonvolatile memory device of claim 17, wherein the output of the first register is selected where the count value is less than the reference value.

19. A memory system comprising:
   a nonvolatile memory device; and
   a controller configured to control the nonvolatile memory device, the nonvolatile memory device comprising:
   a memory cell array;
   a read/write circuit configured to access the memory cell array; and
   a control logic circuit configured to provide a program voltage to the memory cell array and control a program operation to be performed by repeated program loops,
   wherein the control logic circuit is configured to adjust an initial program voltage used during the program operation based on a number of program loops performed between detection of at least one program-passed memory cell and completion of a prior program operation.

20. The memory system of claim 19, wherein the nonvolatile memory device and the controller constitute a solid state drive.

21. A method of programming a nonvolatile memory device including multi-level memory cells, each respectively capable of storing a Most Significant Bit (MSB) and a Least Significant Bit (LSB), the method comprising:
   programming the LSB of the memory cells using a LSB program voltage that is incrementally increased from a first LSB program voltage level to a second LSB program voltage level at which at least one of the LSB programmed memory cells is determined to be a program-passed;
   determining an initial level for a MSB program voltage to be used during MSB programming of the memory cells according to a number of LSB program loops required to increment the LSB program voltage from the first LSB program voltage level to the second LSB program voltage level; and then,
   programming the MSB of the memory cells using a MSB program voltage.

22. The method of claim 21, wherein the number of LSB program loops is sequentially executed beginning with a first LSB program loop, and the first LSB program loop uses a stored default value to define the first program value level.

23. The method of claim 22, wherein following each sequentially executed LSB program loop beginning with the first LSB program loop, the method further comprises:
   determining whether or not at least one of the memory cells is programmed-passed.

24. The method of claim 23, wherein upon determining that at least one of the memory cells is not programmed-passed, incrementing a LSB program loop count value.

25. The method of claim 21, wherein the memory cells are arranged according to a plurality of word lines and determining the initial level for a MSB program voltage to be used during MSB programming of the memory cells according to a number of LSB program loops required to increment the LSB program voltage from the first LSB program voltage level to the second LSB program voltage level is made independently for each one of the plurality of word lines.

26. The method of claim 21, wherein each of the memory cells is respectively capable of storing a Center Significant Bit (CSB), and the method further comprises:
   determining an initial level for a CSB program voltage to be used during CSB programming of the memory cells according to the number of LSB program loops required to increment the LSB program voltage from the first LSB program voltage level to the second LSB program voltage level; and
   programming the CSB of the memory cells using a CSB program voltage that is incrementally increased from the initial level of the CSB program voltage.

* * * * *